Feb. 18, 1964 T. H. STEARNS 3,121,771

ELECTRICAL CONNECTOR

Filed Sept. 15, 1960

Thomas H. Stearns
INVENTOR
Robert O. Richardson
ATTORNEY 3,121,771
ELECTRICAL CONNECTOR Thomas H. Stearns, Wilton, N.H., assignor to Sanders Associates, Inc., Nashua, N.H., a corporation of Delaware Filed Sept. 15, 1960, Ser. No. 56,195
2 Claims. (Cl. 174—68.5)

This invention relates to electrical connection means and more particularly, to means for making connections between printed circuit articles and electrical devices.

The ordinary printed circuit article generally includes an insulating base on which is mounted a plurality of electrical conductors in a desired configuration. These conductors have some predetermined terminal configuration for connection to an electrical device or devices. It is frequently desirable to connect, for example by soldering, a plurality of these terminals to a single electrical device. The fact that the printed circuit and electrical device terminals have a fixed spatial relation relative to each other makes it very difficult to remove the electrical device from the printed circuit after connections have been made. For example, if an electrical device having a plurality of contact pins were soldered to a printed circuit board having a plurality of terminals, for the purpose of making both a mechanical and electrical connection, the electrical device could only be removed from the printed circuit board by heating all the solder joints in unison. This method of disconnecting the device from the circuit is both impractical and very often results in destruction of either the device or the printed circuit.

In the present invention, an intermediate member is disposed between each conductor terminal and electrical device contact pin. Each pin is separately mechanically and electrically coupled to an intermediate member. To complete the assembly, the intermediate members are separately coupled to each terminal. Since no two intermediate members are rigidly connected to each other, they may be separately removed from the terminals. Thus, any of the circuits on the circuit board may be removed from the electrical device without disturbing the connections of the others. In this manner, there is provided a simple and economical means for facilitating both partial and full connection and disconnection of electrical devices from printed circuits.

It is, therefore, an object of the present invention to provide a new and improved printed circuit electrical connection means.

Another object of the present invention is to provide a more efficient method of connecting and disconnecting electrical devices from printed circuits.

Another object is the provision of a circuit connection means whereby one or more of a plurality of connections may be made between two electrical devices without disturbing the other connections.

These and other objects will become more apparent as this invention is more fully disclosed.

In accordance with the present invention, there is provided an electrical connection means, comprising a conductor having a terminal for electrical connection to an electrical device. There are provided connection means mechanically and electrically coupled to the terminals. The connection means are adapted for mechanical and electrical coupling to an electrical device, whereby the conductor terminal is electrically coupled to the device.

As used herein, the term "plastic" includes a synthetic organic material of high molecular weight, and which, while solid in the finished state, at some state in its manufacture, is soft enough to be formed into shape by some degree of flow.

The well-known term "Kel-F" as used herein is the trademark of the Minnesota Mining and Manufacturing Company and refers to the plastic trifluorochloroethylene as manufactured by them.

The well-known term "Teflon" as used herein is the trademark of the E. I. du Pont de Nemours & Co., Inc. and refers to the plastic polymer tetra-fluoroethylene as manufactured by them.

The term "ethylene" includes all those plastic materials containing an ethylene radical, and the term "vinyl" includes all those plastic materials containing a vinyl radical.

The term "Saran" trademark of the Dow Chemical Company, is used herein to denote those plastic materials containing a vinylidine radical.

The term "nylon" as used herein refers generically to the group of plastic materials known as polyamides.

For a better understanding of the present invention, reference is made to the following description with the accompanying drawings, and its scope will be pointed out in the appended claims.

Figures 1, 2, 3, 4:
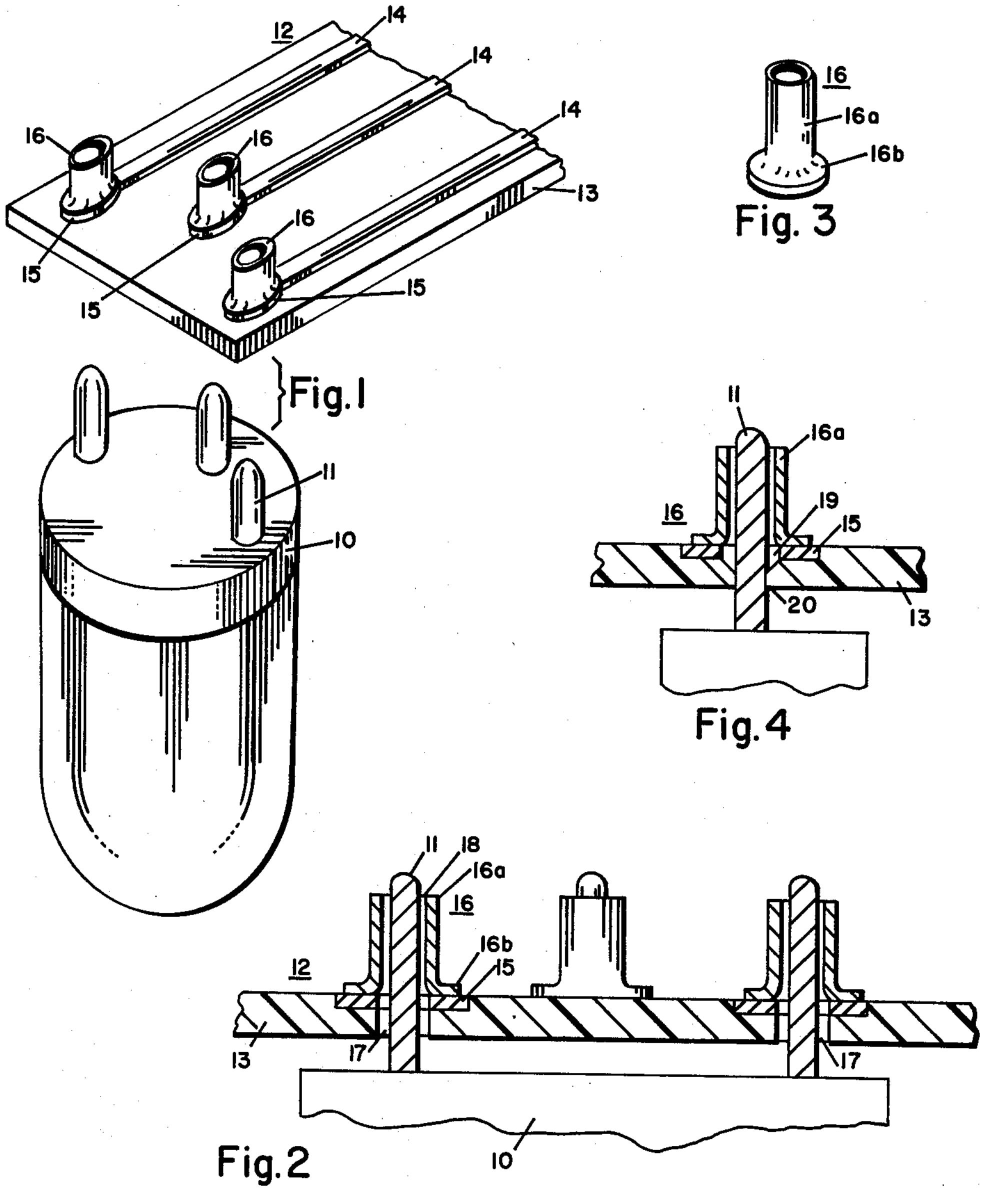
FIG. 1 is a perspective view showing the preferred embodiment of an electrical connection means embodying the present invention.
FIG. 2 is a front elevation view, in section, of the electrical connection means shown in FIG. 1.
FIG. 3 is a perspective view of the connector used.
FIG. 4 is a front elevation, in section, of another embodiment of the present invention.

Referring now to the drawings, and with particular reference to FIG. 1, there is shown a perspective view of a typical application of the present invention. An electrical device 10, having elongated contact pins 11, disposed in a predetermined configuration is shown prior to its connection to a printed circuit 12. The printed circuit 12 includes an electrically insulated baseboard 13 and a plurality of conductors 14 mounted thereon. The conductors 14 have terminals 15 disposed in a predetermined configuration for connection to the pins 11 of the electrical device 10. As can be seen, both the terminals 15 and contact pins 11 have a fixed spatial relationship relative to each other. Therefore, once the contact pins 10 are soldered to the terminals 15 the only way to disconnect the electrical device 10 from the printed circuit 12 without destruction of the components would be to heat all the solder joints in unison. While there are shown three contact pins 11 in FIG. 1, it will be apparent that the problem of disconnection will be greatly magnified as the number of contact pins increase. In order to allow for disconnection of the electrical device 10 from the printed circuit 12, metallic connectors 16 are connected to the terminals 15 as shown. The contact pins 11 are inserted into the apertures in the metallic connector 16 and soldered to the inner wall thereof. To disconnect the electrical device, each metallic connector is individually heated and removed from its associated terminal 15. When all the connectors are thus removed the electrical device will be disconnected from the printed circuit 12. Although the invention is described as applied to a printed circuit in which the conductors are mounted on an insulating base, it will be apparent that it will be useful wherever an electrical device having a plurality of substantially fixed contacts is to be connected to a plurality of substantially fixed terminals. The term "fixed" as used herein is intended to mean fixed in space relative to one another after connection is made.

Referring now to FIG. 2, there is shown a front elevation section of the electrical connection means shown in FIG. 1. The printed circuit 12 includes an insulating base 13 made of an insulating plastic material such as Kel-F, Teflon, nylon, and XXXP Phenolic, glass filled plastics, etc., and a plurality of copper conductor paths mounted thereon. These paths may be formed by laminating a sheet of conductive material to the insulating base 13 and etching out the desired conductor and terminal configuration. In the preferred embodiment, an aperture 17 is made through the insulating base 13 and terminal 15 and is adapted to receive the contact pin 11. The contact pin 11 is inserted through the aperture and extended to a height sufficient for obtaining a good solder joint between the pin 11 and the metallic connector 16. This connector 16 is made of a conductive material, preferably of copper. The connector is inserted over the pin 11 so that the cylindrical wall portion 16*a* thereof is substantially concentric with the pin 11, and the flange 16*b* is in abutting relation with the terminal 15. A soldering iron may then be used to heat the tube and solder is applied between the inner wall of the connector and the pin 11. By capillary action the solder flows between the pin and the inner wall 16*a*, and between the abutting surfaces of the flange 16*b* and terminal 15. Thus, there will be a solder connection between the flanges 16*b* and the terminal 15 and the inner wall 16*a* of the connector and pin 11. Thus, there is provided a connection means in the form of a cylindrical inner wall for mechanically and electrically coupling the pins 11 of electrical device 10 to the connection means 16. The connection means also include means for electrically and mechanically coupling the circuit terminal 15 and the connector flange 16*b*.

To disconnect the electrical device from the circuit the metallic connector 16 may once again be heated, for example, by a soldering iron and slipped off the terminal and above the pin by using a tweezers, for example.

A perspective view of the metallic connector is shown in FIG. 3. The tube is preferably made of a metal that is both a good electrical and thermal conductor. Thus, when flange 16*b* is heated, the heat will be transferred to the solder joining the pin and cylindrical wall 16*a*, allowing disconnection of the pin from the circuit by lifting the connector upward.

In FIG. 4 there is shown another embodiment of the present invention. In FIG. 4 an aperture 20 of approximately the same diameter of the pin is first made in the insulating base 13 and terminal 15. A conical pointed drill is then fed through the terminal and part way through the insulating base to provide a conical surface 19 as shown. This particular construction aids in centering the pin 11 within the connector wall 16, and the conical relief 19 prevent solder from bridging the terminal 15 and pin 11. The presence of the conical relief, section 19, provides too wide a spacing for the capillary action which tends to draw the solder along the cylinder 16 from connecting terminal 15 to pin 11. If the terminals and pins become bridged with solder, then the utility of a readily removable connector is lost.

While there have been described what are at present considered to be the preferred embodiments of this invention, it will be obvious to those skilled in the art that various changes and modifications may be made therein without departing from the invention, and it is, therefore, aimed in the appended claims to cover all such changes and modifications as fall within the true spirit and scope of the invention.

What is claimed is:

1. The combination with an electrical device having connector pins extending therefrom in one direction and an insulating base having perforations therethrough and conductors on a surface thereof, said conductors having terminals located on the upper surface of the base at said perforations and extending about the same, of connection means connecting said connector pins with said terminals on the insulating base, said connection means each comprising a cylinder entirely above the base, surrounding one of said pins, and said cylinder having a flange above the base and having its lower face secured to and abutting one of said terminals on the insulating base, said flange abutting that face of the terminal opposed to the face in contact with the insulating base, said pins each extending from a component on the side of the base opposite the cylinder and extending through an individual one of said perforations and into the cylinder and soldered thereto.

2. The combination of claim 1 wherein said pins are male connector pins and said terminals extending about the perforations have openings larger than said pins to prevent electrical bridging thereacross.

References Cited in the file of this patent

UNITED STATES PATENTS

| | | |
|---|---|---|
| 2,438,075 | Smith | Mar. 16, 1948 |
| 2,586,854 | Myers | Feb. 26, 1952 |
| 2,593,479 | Nieter | Apr. 22, 1952 |
| 2,902,629 | Little et al. | Sept. 1, 1959 |
| 2,950,458 | Artz | Aug. 23, 1960 |